United States Patent
Hsu et al.

(10) Patent No.: US 7,545,161 B2
(45) Date of Patent: Jun. 9, 2009

(54) METHOD AND APPARATUS TO MEASURE THRESHOLD SHIFTING OF A MOSFET DEVICE AND VOLTAGE DIFFERENCE BETWEEN NODES

(75) Inventors: Louis Hsu, Fishkill, NY (US); Jong-Ru Guo, Wappingers Falls, NY (US); Ping-Chuan Wang, Hopewell Junction, NY (US); Zhijian Yang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 22 days.

(21) Appl. No.: 11/832,796

(22) Filed: Aug. 2, 2007

(65) Prior Publication Data
US 2009/0033355 A1   Feb. 5, 2009

(51) Int. Cl.
G01R 31/02  (2006.01)
(52) U.S. Cl. .................... 324/763; 324/158.1
(58) Field of Classification Search ......... 324/763–765, 324/98, 158.1
See application file for complete search history.

(56) References Cited

U.S. PATENT DOCUMENTS

| | | | |
|---|---|---|---|
| 4,036,057 A * | 7/1977 | Morais | 73/587 |
| 4,326,245 A * | 4/1982 | Saleh | 363/79 |
| 5,307,315 A * | 4/1994 | Oowaki et al. | 365/189.09 |
| 5,397,934 A * | 3/1995 | Merrill et al. | 327/537 |
| 5,640,079 A * | 6/1997 | Nelson et al. | 320/153 |
| 5,940,682 A | 8/1999 | Tabara | |
| 5,959,309 A | 9/1999 | Tsui et al. | |
| 5,966,024 A | 10/1999 | Bui et al. | |
| 6,143,579 A | 11/2000 | Chang et al. | |
| 6,222,395 B1 * | 4/2001 | Bertin et al. | 327/77 |
| 6,441,680 B1 | 8/2002 | Leung et al. | |
| 6,653,890 B2 * | 11/2003 | Ono et al. | 327/537 |
| 6,771,116 B1 | 8/2004 | Wang et al. | |
| 6,937,052 B2 * | 8/2005 | Tam | 324/765 |
| 6,965,247 B2 * | 11/2005 | Nadal Guardia | 324/763 |
| 7,248,124 B2 * | 7/2007 | McCorquodale et al. | 331/44 |
| 7,332,953 B2 * | 2/2008 | Pineda De Gyvez et al. | 327/534 |
| 2004/0261713 A1 * | 12/2004 | Kim et al. | 118/723 E |
| 2005/0057220 A1 * | 3/2005 | Miwa et al. | 320/116 |

* cited by examiner

*Primary Examiner*—Ha Tran T Nguyen
*Assistant Examiner*—Richard Isla Rodas
(74) *Attorney, Agent, or Firm*—H. Daniel Schnurmann

(57) ABSTRACT

An on-chip circuit to quantitatively measure threshold voltage shifts of a MOSFET. The circuit includes a programmable Vt reference sensor; a programmable Vt monitoring sensor; and a comparator for receiving inputs from the reference and monitoring sensors providing an output flag signal. The shifting of the MOSFET device voltage threshold monitors process variations, geometry sensitivity, plasma damage, stress, and hot carriers and other device damages. The same circuit also measures voltage differences between any two nodes in an integrated circuit chip or wafer.

14 Claims, 9 Drawing Sheets

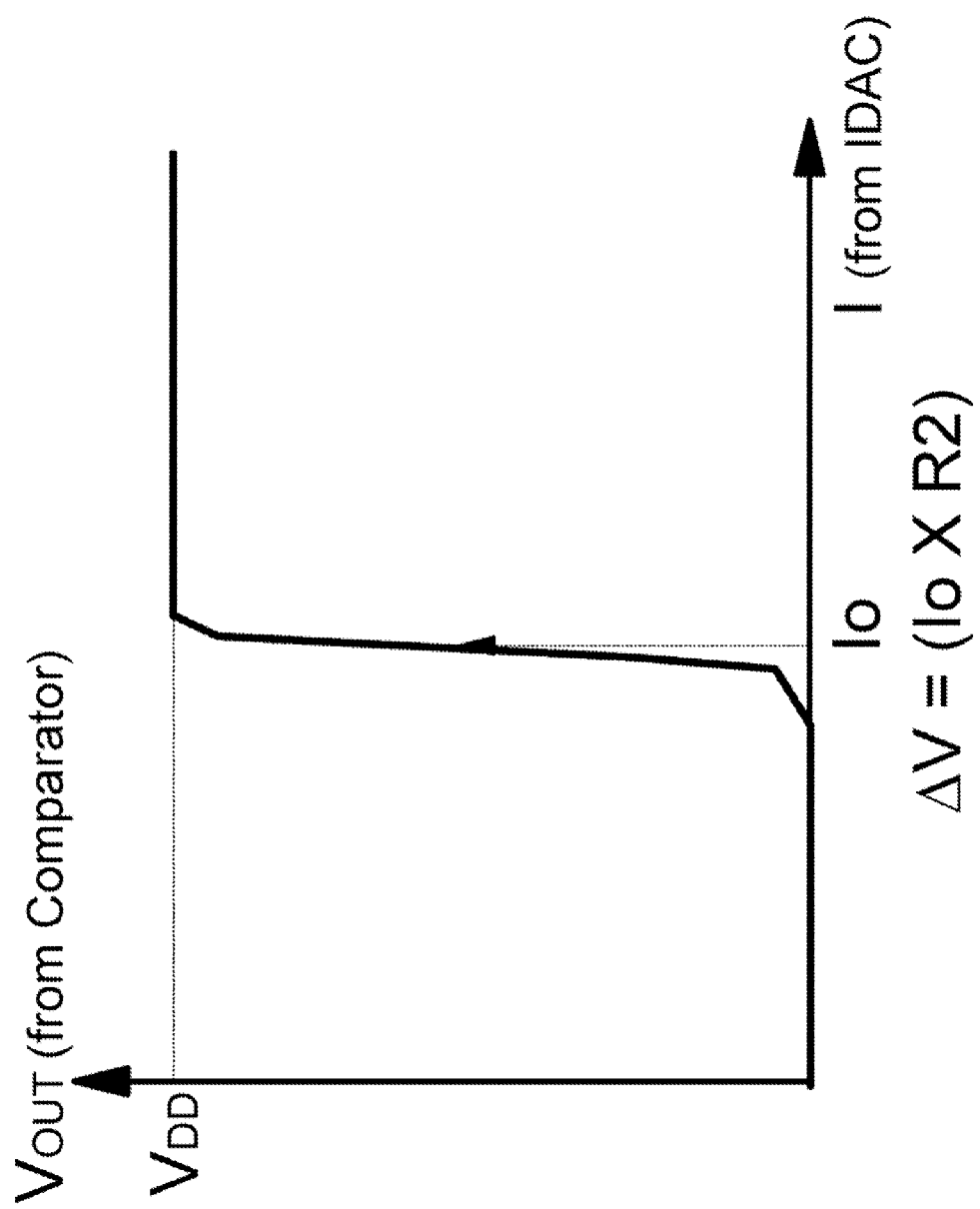

METHOD AND APPARATUS TO MEASURE THRESHOLD SHIFTING OF A MOSFET DEVICE AND VOLTAGE DIFFERENCE BETWEEN NODES

FIELD OF THE INVENTION

The present invention relates generally to a method and an apparatus for quantitatively measuring a threshold voltage shift in a MOSFET device, and more particularly, to a method for collecting threshold voltage, or node voltage difference data between two MOSFET devices, in a semiconductor wafer or integrated circuit chip.

DESCRIPTION OF THE RELATED ART

MOSFET threshold voltage, henceforth referred to as Vt, is one of the critical device characteristics to be considered in device designing, fabricating, and circuit implementing. Theoretically, the Vt value is controlled by intrinsic device properties such as dimension, source/drain engineering, doping profile, gate dielectric parameters, body conditions, and the like. However, various other factors often cause Vt to shift, such as post-intrinsic device process and subsequent device operation or wear-out. By way of example, it is well known that plasma treatments, heavy ion bombardment or x-ray lithography during device fabrication can damage the gate dielectric, which is one of the most serious problems for MOSFET devices. Plasma related damages will cause the device Vt either shift out of original spec window immediately after fabrication or experience faster degradation during device burn-in or normal operation. During semiconductor fabrication, there are many processes involving plasma treatment, such as ion implantation, plasma assisted material depositions, and plasma-assisted dry etching. Some of these plasma processes are employed in every metal layers up to the last one.

In another example, Vt shifting occurs as a result of device degradation under stress and operating conditions or during fabrication. It has been well documented that most of the device degradation mechanisms, e.g., bias-temperature instability (BTI) and channel-conducting hot carrier effect (CHE), induce Vt shifting and significantly impact the circuit performance. It is therefore necessary for circuit designers to create a reliability model for projecting Vt based on the design. On the other hand, it is also known that devices that are placed closer to a well or shallow trench isolation (STI) boundary also suffer form Vt shift problems comparable to those located away from the boundary. More specifically, devices that are located closer to the boundary experience more stress than those further away. Such stress induced Vt shift has typically resulted in a Vt variation problem which is detrimental to the design of analog circuits.

As MOSFET devices advance into nano-node stage, the gate dielectric is becoming increasingly sensitive to processing damage and wear-out mechanisms. For all these reasons, quantitative monitoring of Vt shift has imposed demands on the manufacturing control to ensure robust circuit performance and adequate reliability.

In the prior art, Vt values are commonly measured by full-blown device characterization, including Id-Vg sweeps conducted in both linear and saturation modes. This implies that the entire characterization has to be conducted before and after the plasma process/reliability stress in order to determine the amount of Vt shifting induced. Disadvantages associated with this traditional approach include the following: (1) they are not practical for in-line monitoring of charging effect, especially in products where a large throughput is needed, and (2) the accuracy is greatly compromised, since the stress-induced Vt shifting is partially recoverable and the traditional measurement is too slow to capture a Vt shift before relaxation.

By quantitatively measuring Vt-shift, the present invention can be implemented as an in-line manufacturing process monitor and circuit performance tracking sub-circuit. In addition, the Vt-shift can be measured before and after a dedicated reliability stress which reveals more information about the device itself.

Damages caused by plasma process have been monitored by different techniques, such as off-line measurements of Vt and gate oxide breakdown voltages. By way of example, U.S. Pat. No. 5,959,309 describes an approach to assess plasma damage experienced during fabrication using standard I/V sweeps off-line. U.S. Pat. No. 6,143,579 describes a method of monitoring a wafer to determine the dielectric breakdown off-line. U.S. Pat. No. 5,940,682 describes a technique for measuring the shift in flat-band voltage to estimate the amount charges injected into a capacitor during plasma treatment.

None of the cited prior art references describe an in-situ monitoring of the process/wear-out induced damage, and neither are they able to characterize Vt shift quantitatively, which is known to be a highly relevant parameter for consideration in many circuit applications.

Other related patents include:

U.S. Pat. No. 5,966,024 which describes measuring the relative current shift to project Vt-shift. The method proposed does not quantify Vt-shift directly and, furthermore, it relies on an assumption that Ids-Vgs slopes before and after shift are identical. This is known today to be invalid under reliability stresses. For example, hot-carrier stress degrades MOSFET devices by changing the sub-threshold slope. More importantly, in circuits like SRAM applications, Vt is a more critical device parameter than current (e.g., Ids) in considering circuit functionality. No mention is made on how to directly measure Vt or Vt-shift.

Furthermore, there are circuit related patents using ΔVt to generate reference voltage, such as U.S. Pat. No. 6,222,395, No. 6,771,116, and No. 6,441,680. The value of Vt difference is not explicitly expressed or recorded. Among these patents, there is either no need or means provided to quantitatively record such reference voltage. None of the aforementioned patents address the problem on how to measure and read out Vt differences quantitatively, and neither have they taught how to measure Vt shifts in a device during processing and device life time.

SUMMARY OF THE INVENTION

Accordingly, it is a primary object of the invention to provide a method and an apparatus for quantitatively measuring Vt shifts of a MOSFET device in a wafer or a chip.

It is another object of the invention to create an automatic testing protocol so that the exact amount of the Vt-shift of the MOSFET device can be precisely read during wafer or chip testing.

It is still a further object of the invention to avoid device mismatches caused by an improper physical layout or process variations so that the absolute Vt-shift of the target device can be accurately determined.

In a first aspect of the invention, there is provided a circuit for sensing threshold voltage (Vt) differences between a reference and target devices. The circuit consists of a Vt voltage shift sensing element; a voltage regulator providing a stable output voltage which does not vary with temperature, process variations, and power supply voltage, and the like; a voltage-to-current and current-to-voltage converter, a comparator for comparing the Vt measured at a reference and a target device, and generating an output flag signal resulting from the outcome of the comparison.

In another aspect of the invention, the voltage difference between two or more voltage nodes in a chip or a wafer is measured. This voltage difference is preferably quantified by way of a Vt or $\Delta V$ (delta V) measurement apparatus (DVMA).

These and other objects, features and advantages of the present invention will become apparent from the following detailed description of illustrative embodiments thereof, which is to be read in connection with the accompanying drawings.

BRIEF DESCRIPTION OF DRAWINGS

The invention will be described in detail in the following description of preferred embodiments with reference to the following figures wherein:

FIG. 6 shows an I-V characteristic plot diagram of a differential amplifier of the Vt-shift measuring unit;

DETAILED DESCRIPTION

A circuit for quantitatively measuring the threshold voltage (Vt) shift of a MOSFET device according to a preferred embodiment of the present invention will be described hereinafter with reference to the accompanying drawings. The same circuit will also be shown to measure voltage differences between any two nodes.

Initially, the circuit will be illustrated to demonstrate how to monitor or measure the Vt shift in a MOSFET device.

As previously mentioned, the Vt shift of a MOSFET is indicative of the degree of process variation, device damage, degradation caused by ion bombardment, radiation, hot carrier effect, gate bias instability, and the like. Normally, the range of Vt-shift oscillates between 1 mV to 70 mV.

Although the preferred embodiment of the invention is generally directed to a circuit designed to quantitatively measure the Vt shift in a MOSFET device (either an NMOSFET or a PMOSFET) in a semiconductor chip or a wafer, it is to be understood that the elements forming the circuit may be implemented in various forms of hardware, software or combinations thereof. These elements implemented in hardware on one or more integrated circuits preferably include software components appropriately programmed using general-purpose testing equipment having a processor and memory and input/output interfaces. The present invention may also be embodied in different forms and should not be construed as limited to the embodiments set forth herein. Rather, these embodiments are provided so that this disclosure will be thorough and complete, and fully convey the invention to those skilled in the art.

It is known that when two identical devices are placed in close proximity of each other, their Vt mismatch may range from 1 mV to 30 mV depending on how the two devices are physically implemented. It is, therefore, crucial that certain layout techniques and guidelines be followed in order to minimize such intrinsic Vt mismatch between the paired devices.

Thus, in order to precisely measure the Vt-shift of a target device against a matching reference device, it is advantageous to first minimize the intrinsic device mismatch due to the asymmetrical layout effects.

Figure 1A:
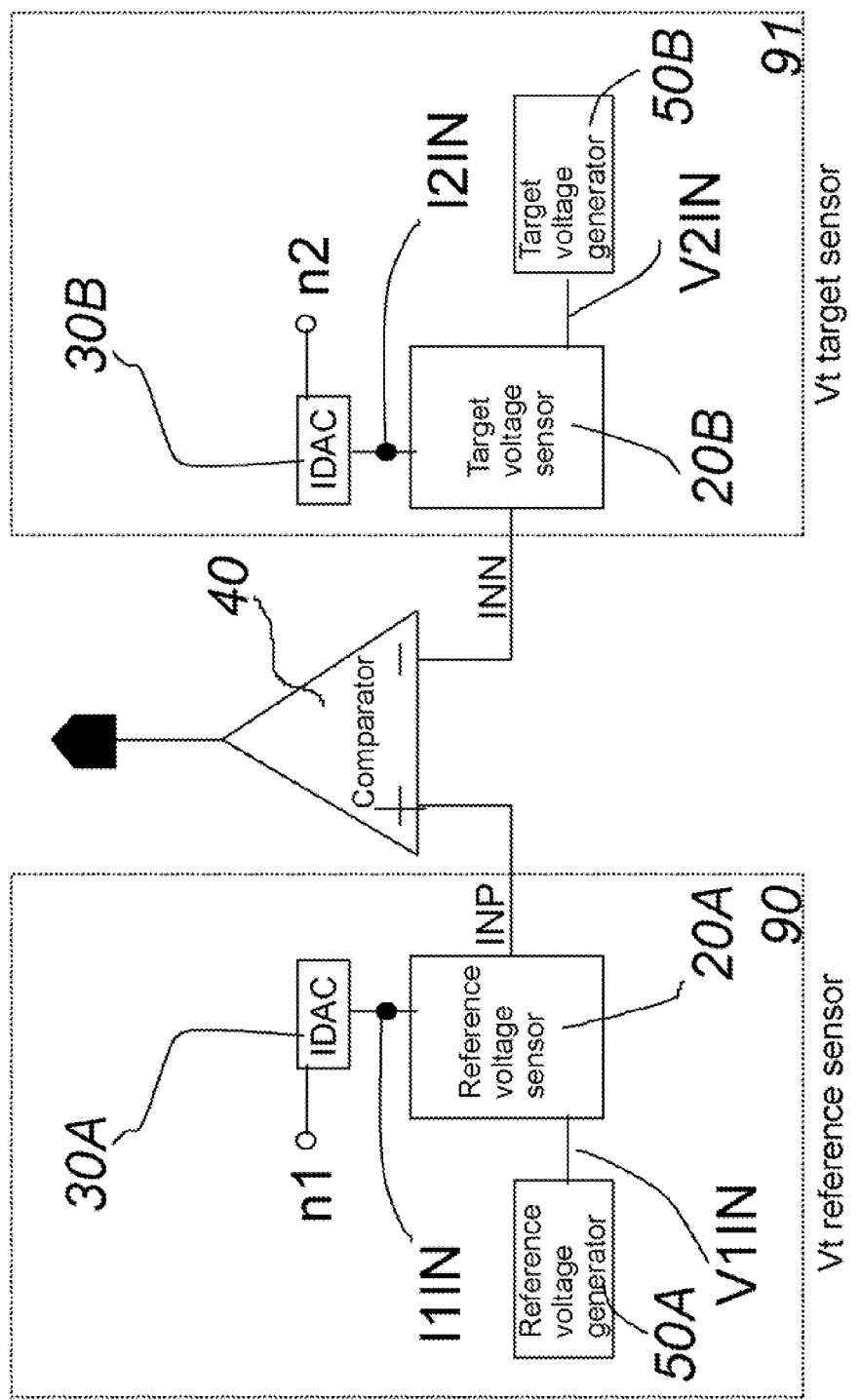
FIGS. 1A-1B are schematic diagrams illustrating an embodiment of a $\Delta V$ measurement apparatus between two nodes in a circuit block (FIG. 1A) and in a layout block (FIG. 1B)

Referring to FIG. 1A, there is shown a circuit block diagram 100 used to measure Vt-shift of a target device. The $\Delta V$ measuring apparatus (DVMA) circuit consists of a Vt reference sensor 90; a Vt target sensor 91 and a comparator 40.

The reference device is a device whose Vt is not subjected to change, and thus can be used as the standard or norm. The targeted device is a device whose Vt is expected to change; therefore when measured against the Vt of reference device, one can quantify by how much its Vt has shifted.

Each Vt sensor preferably includes a voltage generator 50A or 50B; a voltage sensor 20A or 20B and a current mode digital-to-analog converter (IDAC) 30A or 30B. Voltage generators 50A and 50B are coupled to the voltage sensors 20A and 20B via nodes V1in and V2in, respectively. Likewise, the voltage sensors are coupled to the IDAC's via nodes I1in and I2in, respectively. Each IDAC has a set of vectors n1 or n2 that control the current input level via binary coding. They are used to tune the voltage sensors. It is evident that the voltage generator may take the form of an NMOSFET or PMOSFET device Vt monitor to generate a voltage used as a reference voltage or target voltage. For example, a band-gap reference can preferably be used to provide a stable reference voltage that is insensitive to voltage and temperature. The outputs of both voltage sensors INP and INN are fed to a comparator, i.e., differential amplifier 40. When the voltage at INP is higher than INN, then Vout switches to a logic 1. Otherwise, Vout remains at a logic 0.

In the preferred embodiment, it is assumed that Vt of the target device shifts higher or lower depending on the type of device and process conditions. Therefore, each IDAC 30A or 30B can be advantageously used for programming the current. By way of example, if Vt of the targeted device shifts higher, then n1 of IDAC 30A is programmed to measure the amount of Vt shifting. Alternatively, if Vt of the target device shifts lower, then n2 of IDAC 30B is programmed to measure the amount of Vt shifting. In this manner, the proposed apparatus can measure voltage shifting in either direction.

Figure 1B:
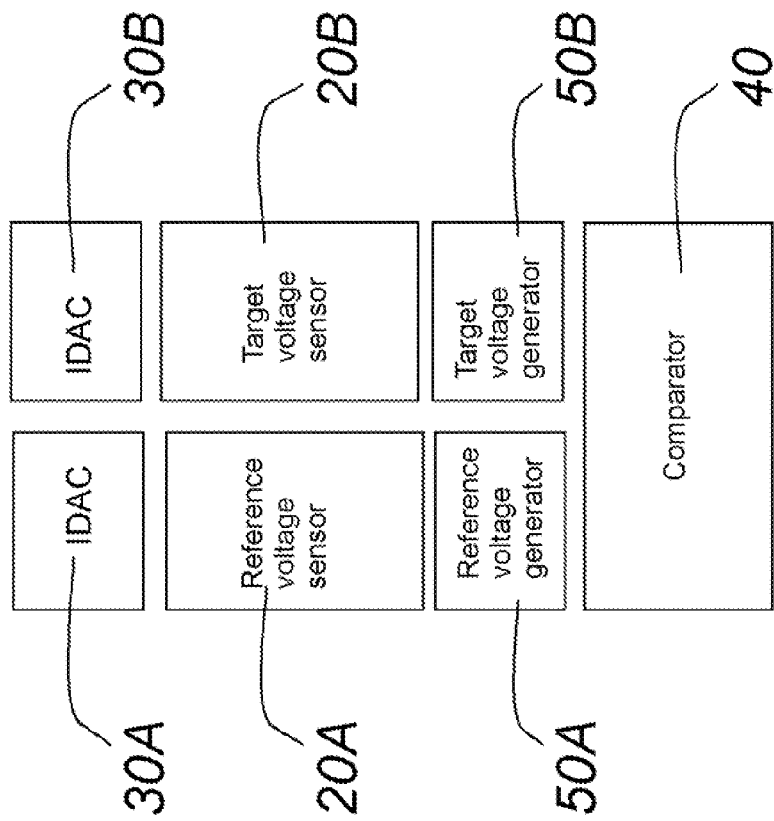

Since it is desirable to obtain a precise Vt measurement, it will be advantageous to first eliminate mismatches caused by process variations. For instance, when a pair of devices is placed side by side, whether an MOSFET device or a resistor, a symmetrical layout must be used to eliminate an induced mismatch caused during a fabrication process. FIG. 1B shows an illustrative physical layout of the circuit shown in FIG. 1A. The pair of blocks 50A and 50B is shown to be physically laid side by side. Similarly, the pair of blocks 20A and 20B is, likewise, also positioned side by side, etc. From a layout point of view, the two pairs of blocks provide a better match in such a symmetric configuration. This technique is known in the art and, thus, will not be discussed further.

Figure 2:
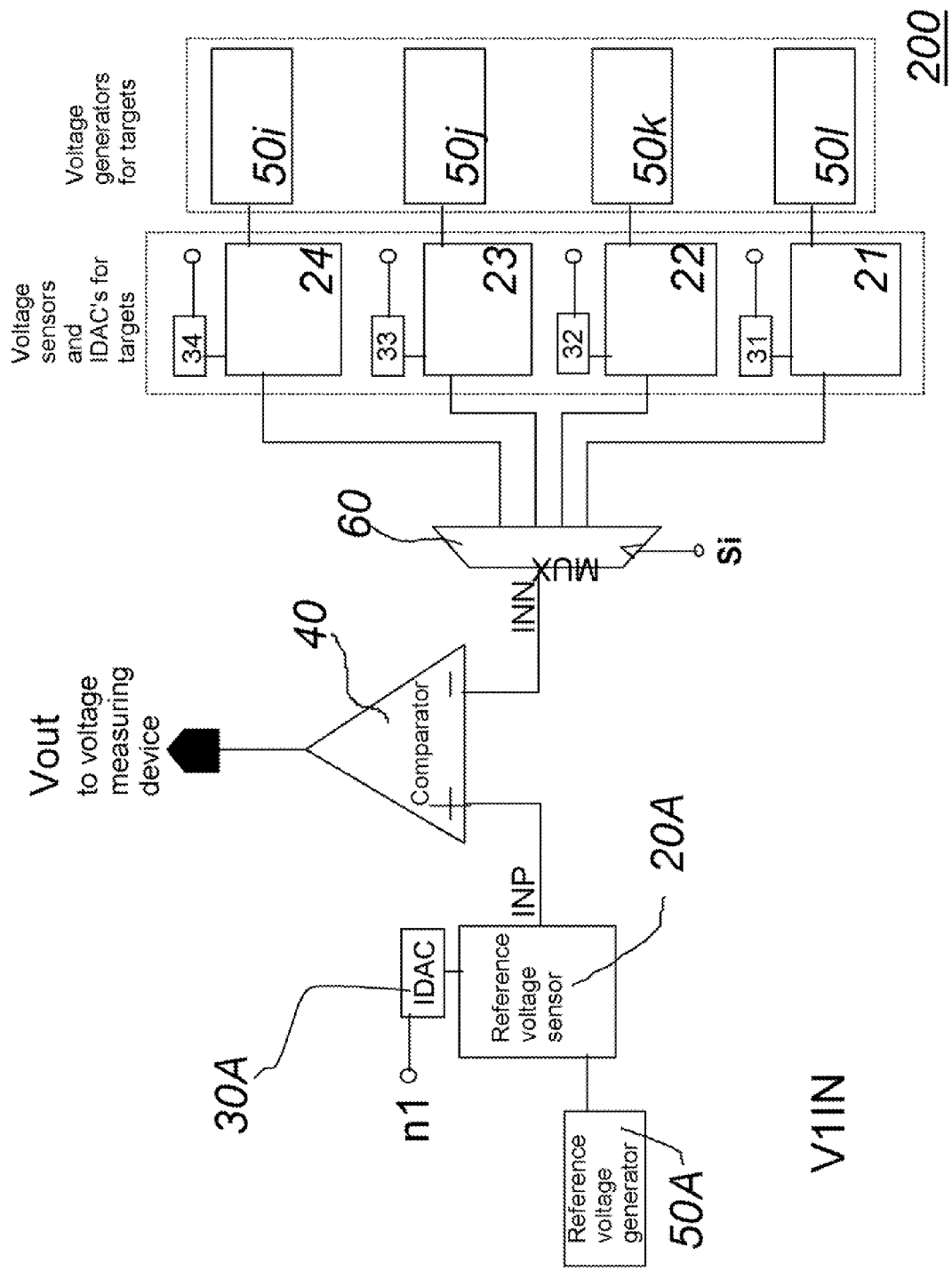
FIG. 2 is a block diagram showing an embodiment of a $\Delta V$ measurement apparatus for a plurality of voltage nodes.

Referring to FIG. 2, there is shown a block diagram of a second embodiment of Vt shift measurement unit 200. Assuming that following a given process, Vt is found to consistently shift higher, and under different situations, Vt of other targeted testsites may shift at different rates. A reference voltage sensor 20A is provided to be used for a plurality of target blocks, e.g. 21, 22, 23 and 24. Each time, only one target block is selected to perform a Vt shift measurement via multiplexer (MUX) 60 activated selected by a control signal Si. This arrangement effectively saves chip area when more than one target block is required, particularly when different target blocks may be necessary for each target device located at different locations. (Such an instance will be discussed in more detail hereinafter). Multiplexer switch 60 is provided to allow a user select one of a plurality of target testsites 50$i$, 50$j$ 50$k$ or 50$l$ for sensing purposes via a respective sensing element, 24,23, 22 or 21, respectively, measuring the Vt difference against reference Vt voltage in 50A with the intent of saving testsite area.

Figure 3:
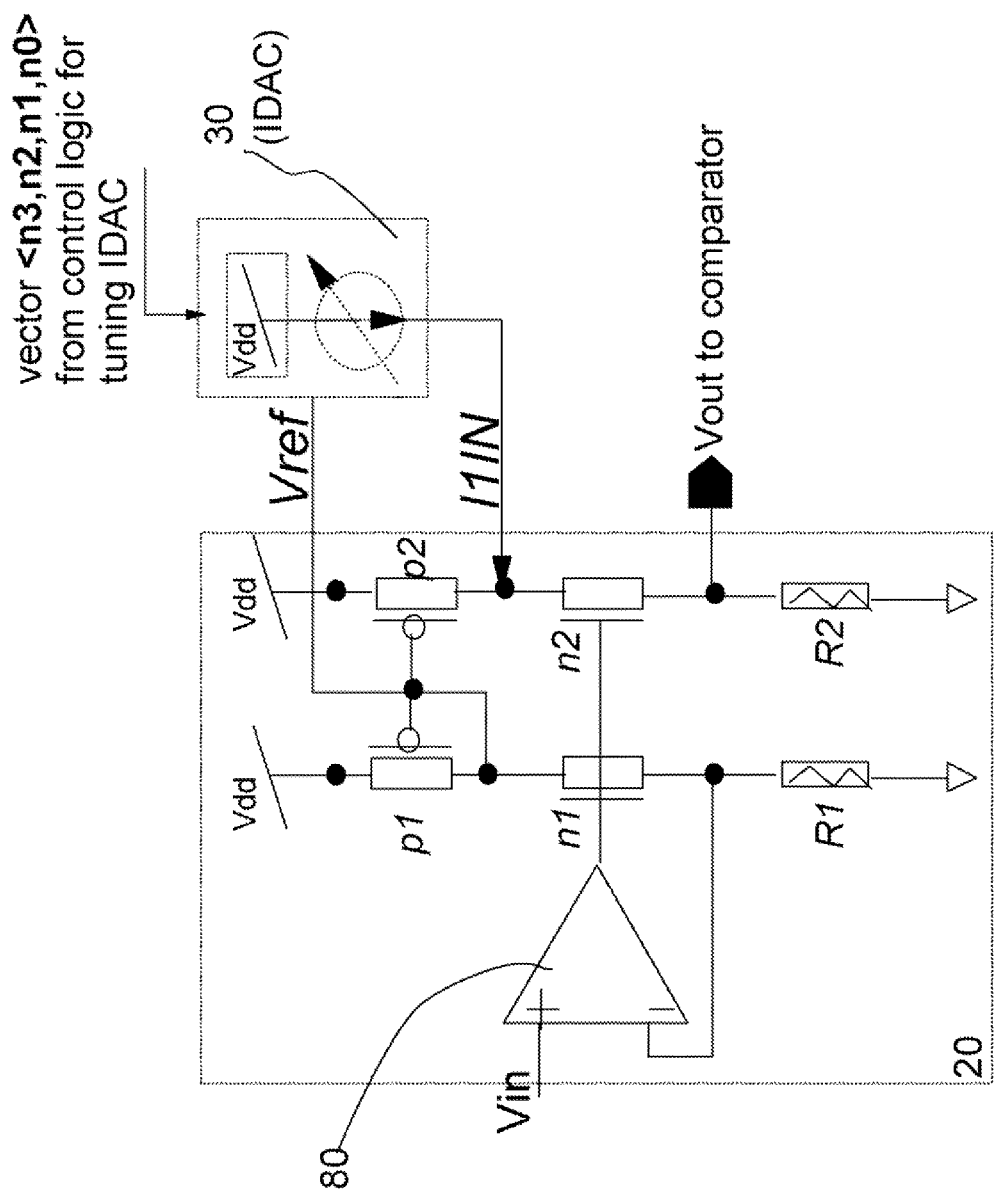
FIG. 3 is a circuit schematic diagram showing an embodiment of a sensing unit of the $\Delta V$ measurement apparatus.

Referring now to FIG. 3, there is shown a diagram of an illustrative sensing circuit 20, consisting of a differential amplifier 80 which receives a reference voltage input Vin, holding the voltage at a selected node between a resistive element R1 and NMOSFET device n1. The output of the differential amplifier 80 is coupled to the gate of the first NMOSFET device n1 and to the gate of the second NMOSFET device n2. The respective drains of NMOSFET devices n1 and n2 are coupled to the drains of PMOSFET device p1 and p2, respectively. (The case where p1 is a PFET diode used to mirror the current to the channel of device p2 and to the IDAC unit 30 will be discussed hereinafter). The reason for providing two stacks of PMOSFET, NMOSFET devices and resistor is intended to decouple the feedback loop of the differential amplifier to the output node of the second stage. It allows the second stage to have the same current flowing as that of the first stage not regulated by the differential amplifier. The voltage at Vout should be sufficiently close to the voltage of the feedback to the differential amplifier which is placed in close proximity to Vin. IDAC is intended to provide and turn an additional current I1IN flowing through resistor R2 such that Vout can be independently adjusted without being influenced by Vin. By tuning I1IN, Vout from the comparator will change from low to high, or vice versa, at current Io. The goal is to measure $\Delta V$ by multiplying the amount of additional current (Io) times the value of R2. The size of devices p1, n1 and R1 is identical to that of p2, n2 and R2, respectively, preferably having a resistor size of about 500 to 5 k ohms.

Figure 4:
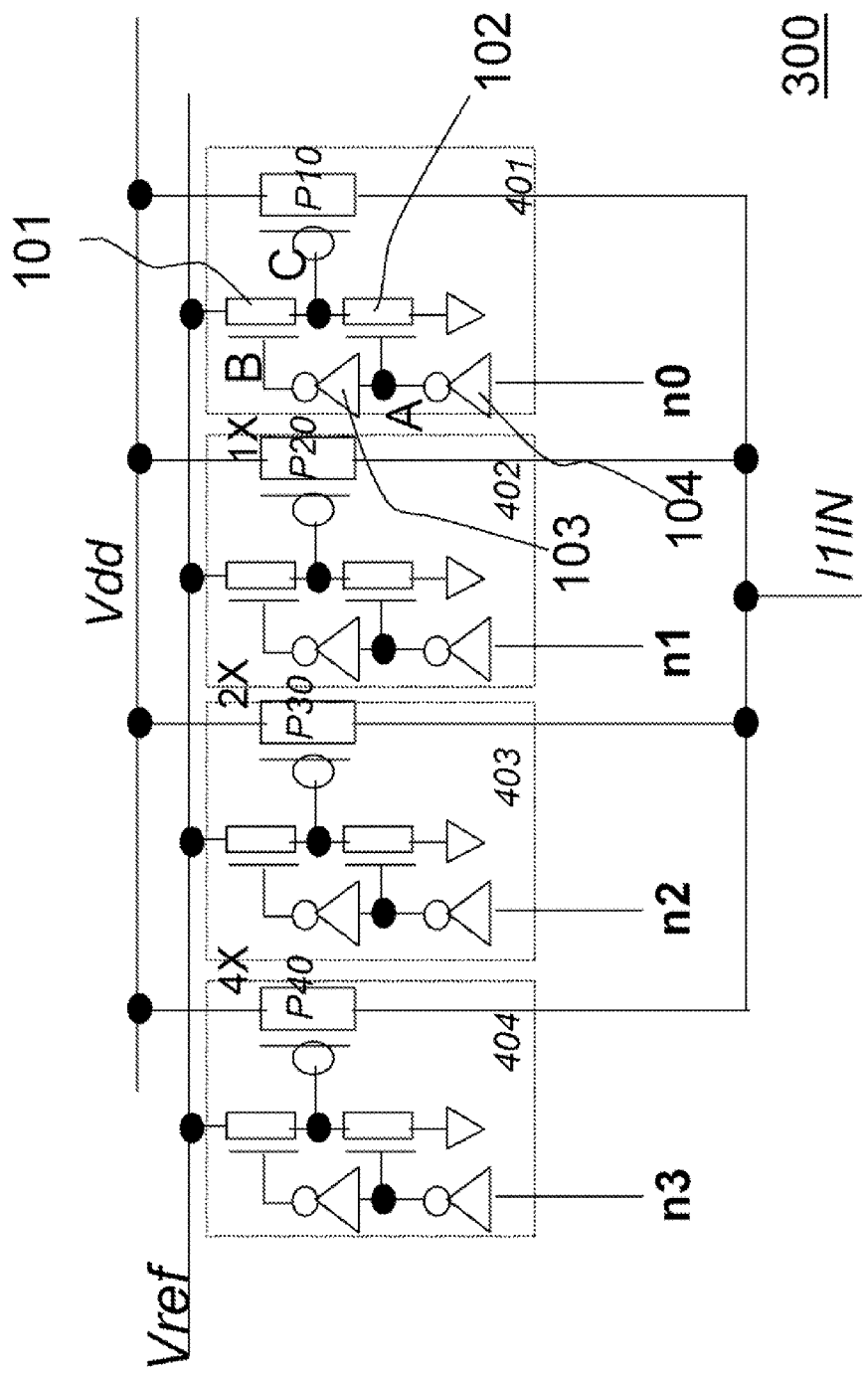
FIG. 4 illustrates a prior art digitally programmable current source (IDAC) used to modulate the sensing unit.

FIG. 4 is a prior art p-type IDAC 300 formed by a plurality of PMOSFET devices p10, p20, p30 and p40 having binary setup. For example, if n0 is the least significant bit, then the size of p20 is twice that of p10, the size of p30 is twice that of p20, and the like. Vref is the voltage received from diodes p20, p30 and p40. The size of the diode is preferably the same as the size of p10. Vector <n3,n2,n1,n0> is used to tune IDAC and provide a different IDAC current level I1IN to the reference voltage sensor. Each PMOSFET device, e.g., p10, is controlled by a switch formed by inverters 103, 104 and NMOSFET 101, 102. For each branch, there are four switching elements 401, 402, 403 and 404. When n0 is activated, NMOSFET 102 shuts off while NMOSFET 101 switches on, connecting node C or the gate of p10 to Vref. At this point, the first branch switches on to produce 1× current, whose function is equivalent to the diode p1 shown in FIG. 3. This digital tuning technique is known in the art, and thus, will not be discussed further.

Figure 5A:
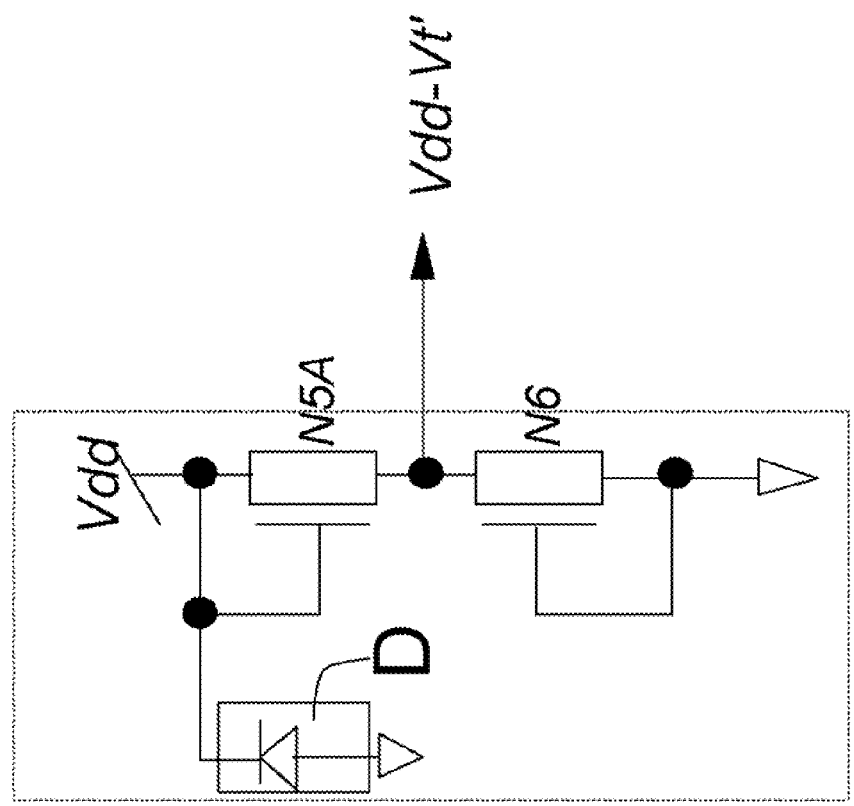
FIGS. 5A-5B are schematic diagrams of n-type MOSFET threshold voltage monitors to be used as a reference voltage generator and/or a target voltage sensor.
Figure 5B:
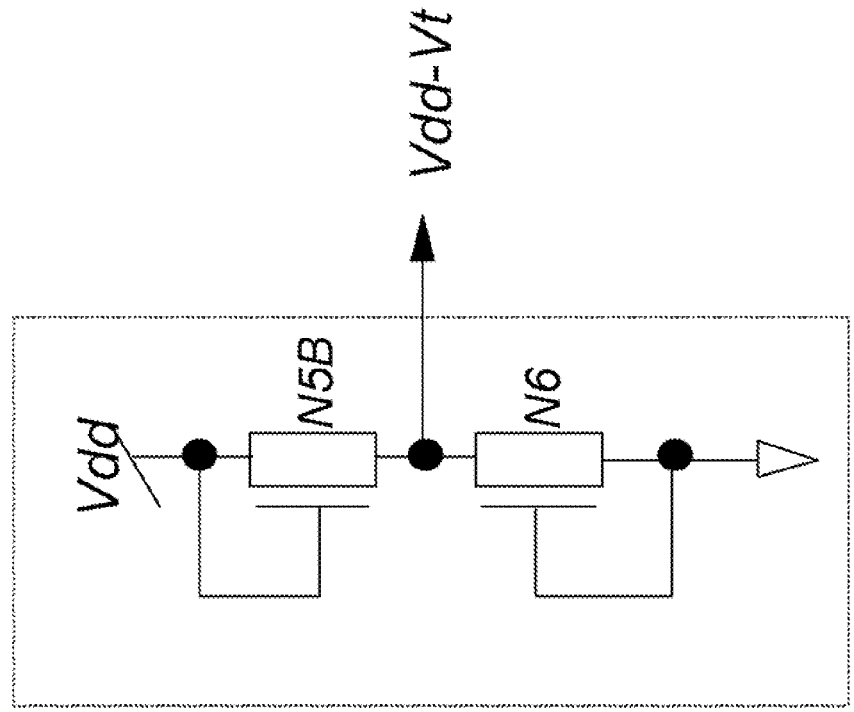

Referring now to FIGS. 5A-5B, there are shown two voltage generators. To study the impact of ion bombardment to the gate of an NMOSFET device, the reference voltage generator shown, e.g., in FIG. 5A, is embodied by NMOSFET N5A with its gate attached to the drain and to power supply Vdd. The gate of N5A is connected to a gate tie-down diode D to prevent damage to the gate dielectric of reference NMOSFET N5A during device fabrication. Practitioners of the art will readily appreciate that other implementations exist to protect the reference device such that its Vt is not altered during processing. Diode D is used to protect the gate integrity against ion bombardment, radiation, during plasma etching, and ion implant. The gate of a MOSFET device formed by conductive material (e.g., doped polysilicon) on top of a gate dielectric is typically left floating during fabrication. Extra charges that accumulate at the dielectric interface have no place to escape, and thus, the built-up potential may damage the dielectric film, and cause a permanent shift of Vt of the MOSFET device. It is well known that a gate tie-down diode allows for such extra charges during processing to be safely discharged to the substrate, thus preserving the gate integrity. The goal herein is to protect the N5A reference device so that no gate dielectric damage is to be expected. Since N5A is an NMOSFET device having its gate connected to drain to form the diode, the voltage at its output is Vdd−Vt'. The pull-down device is an NMOSFET N6 having its gate connected to ground; otherwise, the device shuts off. As an option, NMOSFET N6 can also be protected by the method used for N5A. The target Vt voltage generator shown in FIG. 5B has exactly the same arrangement, but its gate is left unprotected. The output voltage of target Vt generator is (Vdd−Vt) while the reference is (Vdd−Vt'). Therefore, the difference between them is (Vt'−Vt), assuming that Vt'>Vt.

Referring back to FIG. 1A, the outputs of reference Vt sensor INP and of the target Vt sensor INN are connected to the first and second input nodes of the comparator A, respectively. The output of the comparator Vout is monitored by a test probe. A variety of comparators can be advantageously used, such as a differential amplifier, sense amplifier, and the like, to achieve the same goal.

Figure 7:
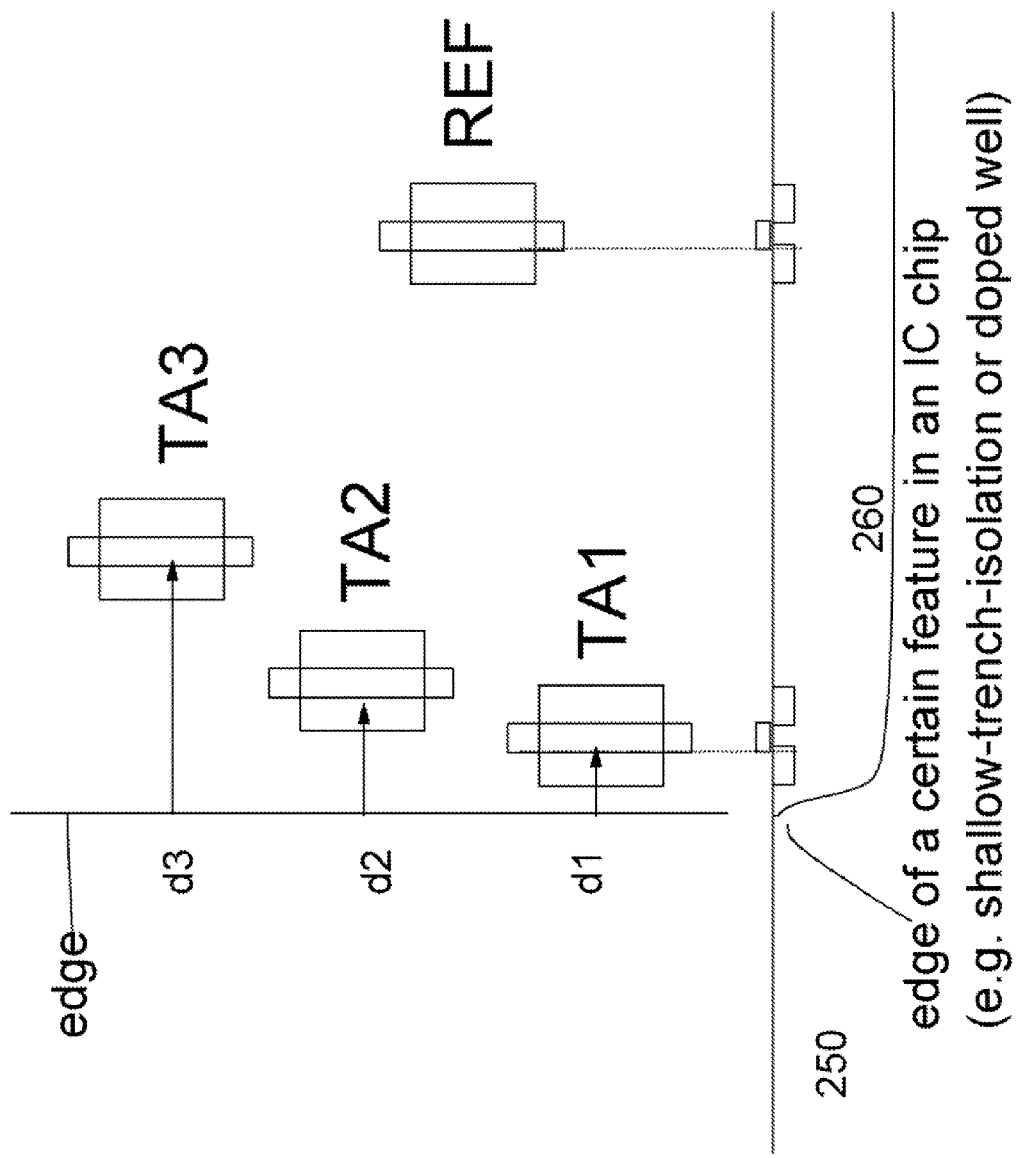
FIG. 7 is an example of a physical design and implementation of the Vt-shift measuring unit.

Referring now to FIG. 6, there is shown a plot illustrating the I-V characteristics of the comparator. If Vt of N5B shown in FIG. 5B shifts for any reason, the output of the comparator Vout will initially remain at a logic low. However, by digitally tuning the IDAC 30 programmable current source, extra current Io is added to the path, and the output of the comparator at some point will switch from low to high. This occurs because the IR drop from resistor R compensates for the Vt difference, which in turn flips the output of the comparator. Accordingly, the amount of Vt shift, or $\Delta Vt$ can be estimated as the additional current Io multiplied by the value of the resistor R, i.e., $\Delta Vt=(Io \times R)$ Referring to FIG. 7, there is shown a physical arrangement of a testsite having a plurality of target devices (TA1, TA2 and TA3) and one reference device (REF). The intent is to design a Vt shift measuring device to quantitatively measure the Vt shift of different target devices positioned at various geometric locations. Devices that are placed at various distances to the edge of a shallow trench isolation (STI) or a doped-well, result in different Vt-shifts. For example, the first target device TA1 has a gate-to-edge distance d1 and displays a Vt shift greater than the second target device TA2, etc. In this case, the reference device must be located at a safe distance away from the edge in order for Vt of the REF device represent the average Vt value of the devices in the bulk silicon. By using the multiplexer (MUX) arrangement shown in FIG. 2, a program can be advantageously used to measure each target device individually.

Figure 8:
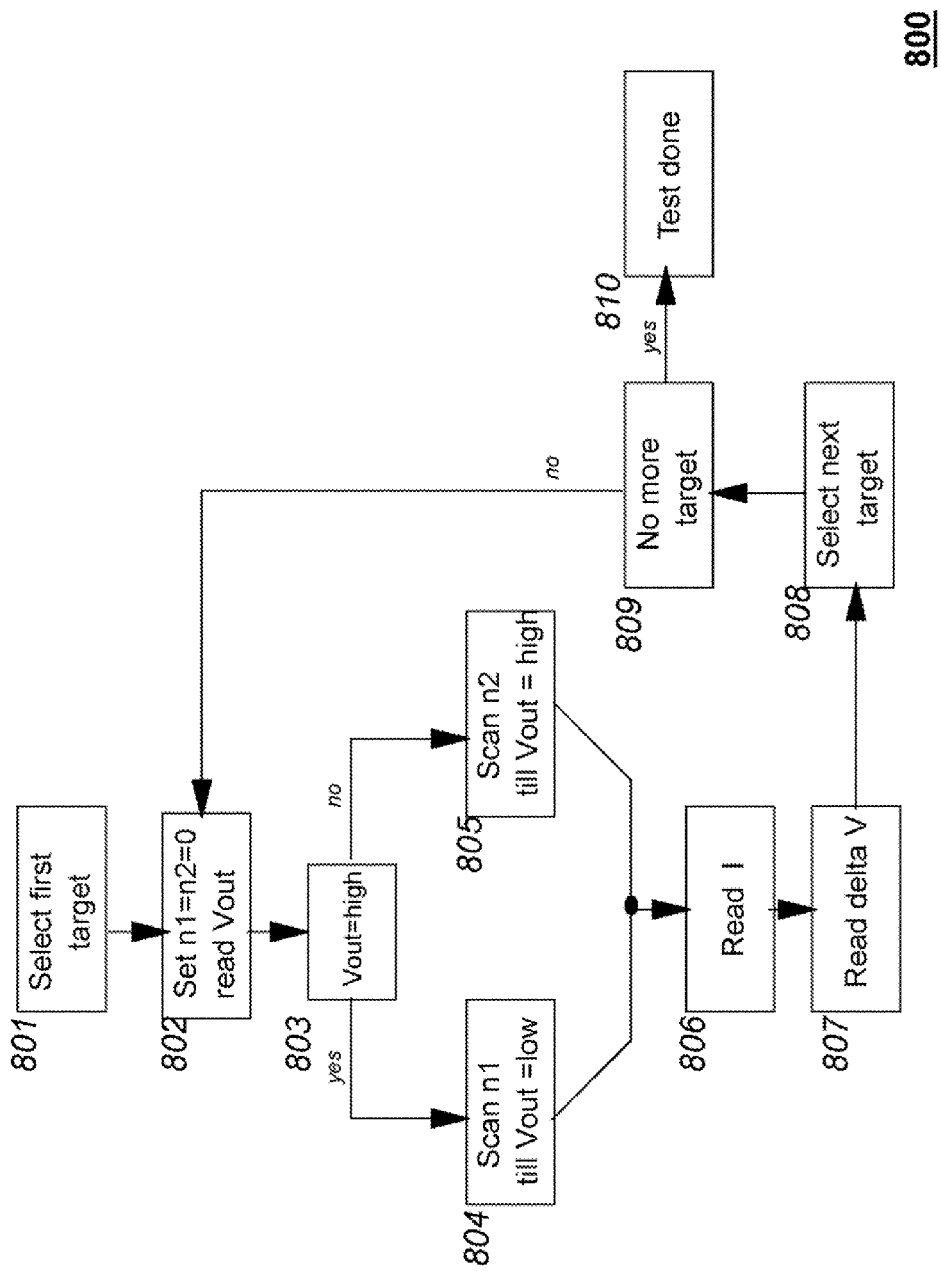
FIG. 8 is a flow chart illustrating the steps for measuring voltage differences between two nodes.

Referring now to the flow chart 800 shown in FIG. 8, a step-by-step sequence is shown to describe how the universal DVMA operates. A test procedure can be programmed for a tester or a built-in state machine for its execution.

The process begins with a first step of selecting a test target 801 to measure the voltage difference against a reference voltage. Initially, according to step 802, both binary vectors n1 and n2 are reset to 0 and Vout is read from the output of the comparator. If Vout is at logic high (step 803), then scanning vector n1 up to Vout switches to logic low (step 804) and the current value I is recorded (step 806). Alternatively, if Vout is at logic low (step 805), vector n2 is scanned up to Vout, switching to logic high. Again, the current value I is recorded and converted to V to estimate the voltage difference, which is then preferably stored in a shift register, completing the first target. The process then proceeds to select and test the next target (step 808). Test steps 802 through 807 are repeated, and the process stop when the last target is completed, i.e., steps 809 and 810.

Data stored in the shift register can be sequentially read out from one test site to another. It will become apparent to practitioners of the art that a plurality of such testsites can be distributed across the chip and strategically positioned in critical areas of the chip.

The DVMA test methodology applies to monitoring voltage variation across the chip. For example, the DVMA sensors can be distributed along a power line, from one point to another, measuring its voltage drop against a voltage constant reference, such as a band-gap reference. A DVMA map voltage distribution can be advantageously displayed across the chip. Excessive voltage drop due to improper layout design leads to chip failure or performance degradation. It is, therefore, desirable that periodical monitoring of voltage drop along one or more power lines during the life of the chip be provided as an early warning to the system. When the power level drops below the threshold level, not only the chip cannot deliver its intended performance, but it can also generate heat that damages the entire system. Therefore, such DVMA approach and other relevant applications prove their usefulness and value, paving the way to fulfill semiconductor auto-testing, self-monitoring, diagnosing and eventually self-repairing.

Having described preferred embodiments of Vt-shift measuring apparatus, it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A circuit for measuring threshold-voltage (Vt) shifts of a MOSFET device, comprising:
   a Vt reference sensor;
   a comparator for receiving inputs from said Vt reference sensor and a Vt target sensor, said comparator having an output coupled to a voltage measuring device, wherein said Vt reference sensor comprises a reference voltage generator connected to a reference voltage sensor; and
   a digitally programmable current source (IDAC) connected to an input of said reference voltage sensor.

2. The circuit as recited in claim 1, wherein said comparator is a differential amplifier.

3. The circuit as recited in claim 1, wherein said Vt reference sensor and target sensor are programmable.

4. The circuit as recited in claim 1, wherein said comparator further provides an output flag signal to said voltage measuring device coupled thereto.

5. The circuit as recited in claim 1, wherein said Vt target sensor further comprises:
   a target voltage generator;
   a target voltage sensor connected to said target voltage generator; and
   an IDAC attached to said target voltage sensor.

6. The circuit as recited in claim 1, wherein said reference voltage generator is protected by a gate tie-down diode to avoid Vt shifting.

7. The circuit as recited in claim 6, wherein when said Vt shifts to an increasing value, said shifting is measured by said IDAC coupled to said reference voltage sensor.

8. The circuit as recited in claim 6, wherein when said Vt shifts to a decreasing value, said shifting is measured by said IDAC coupled to the target voltage sensor.

9. The circuit as recited in claim 1 further comprising a multiplexer having inputs respectively connected to said target voltage sensors and having an output connected to said comparator.

10. The circuit as recited in claim 9, wherein said multiplexer selects one of a plurality of target testsites respectively connected to said target voltage sensors measuring the Vt of said target testsite.

11. An on-chip circuit for measuring threshold voltage (Vt) shifts of a MOSFET device, comprising:
   a Vt reference sensor;
   a plurality of Vt target sensors, each of said plurality of Vt target sensors having a target voltage generator and a target voltage sensing unit, and having their respective output connected to a multiplexer; and
   a comparator for receiving inputs from said Vt reference sensor and an output of said multiplexer, said comparator having an output coupled to a voltage measuring device.

12. A method of measuring threshold voltage (Vt) shifts of a MOSFET device, comprising steps of:
   sensing a Vt reference voltage;
   sensing a plurality of Vt target voltages using a plurality of Vt target sensors, each of which having a target voltage generator and a target voltage sensor, and having their respective output connected to a multiplexer;
   comparing said sensed Vt reference voltage against a voltage at an output of said multiplexer, said multiplexer having an output coupled to a voltage measuring device;
   measuring a reference voltage generated by a reference voltage generator upon sensing a reference voltage generated by a reference voltage sensor; and
   programming a current source (IDAC) connected to an input of said reference voltage sensor.

13. The method as recited in claim 12 further comprising the step of:
   sensing a reference voltage Vt' sensed by said reference voltage sensor;
   sensing a target voltage Vt generated by said target voltage generator and sensed by said target voltage sensor, and having an output thereof connected to a multiplexer provided with an output coupled to a voltage measuring device;

comparing said sensed reference voltage Vt' against a voltage at said output of said multiplexer;

comparing said sensed reference voltage Vt' to said sensed target voltage Vt, and determining a difference (Vt'−Vt), wherein if Vt'>Vt, then Vt is increased by a first voltage amount $\Delta V$ to bring Vt=Vt', wherein $\Delta V = I_o \times R$; and if Vt>Vt', then Vt' is increased to a second voltage amount $\Delta V'$ to bring Vt'=Vt, wherein $\Delta V' = I_o \times R$, Io being an additional current resulting from said comparison, and R is a predetermined resistance value.

14. The method as recited in claim 12 wherein said programming said a current source (IDAC) connected to an input of said reference voltage sensor is performed digitally.

* * * * *